(12) United States Patent
Yatsunami et al.

(10) Patent No.: US 7,785,718 B2
(45) Date of Patent: Aug. 31, 2010

(54) ORGANIC ELECTROLUMINESCENT DEVICE AND METHOD FOR MANUFACTURING THE SAME

(75) Inventors: Ryuichi Yatsunami, Fukuoka (JP); Kei Sakanoue, Fukuoka (JP)

(73) Assignee: Panasonic Corporation, Osaka (JP)

( * ) Notice: Subject to any disclaimer, the term of this patent is extended or adjusted under 35 U.S.C. 154(b) by 566 days.

(21) Appl. No.: 11/011,205

(22) Filed: Dec. 15, 2004

(65) Prior Publication Data

US 2005/0170208 A1    Aug. 4, 2005

(30) Foreign Application Priority Data

Dec. 16, 2003 (JP) ............... 2003-417812
Oct. 15, 2004 (JP) ............... 2004-301560
Oct. 15, 2004 (JP) ............... 2004-301561

(51) Int. Cl.
H01J 1/62 (2006.01)
H01J 9/00 (2006.01)
C09K 11/06 (2006.01)
B05D 5/06 (2006.01)

(52) U.S. Cl. ............ 428/690; 428/917; 313/504; 313/506; 252/301.16

(58) Field of Classification Search ........... 428/690, 428/917; 313/502–509; 427/58, 66; 257/40, 257/88–103, E51.001–E51.052; 252/301.16–301.35
See application file for complete search history.

(56) References Cited

U.S. PATENT DOCUMENTS

| | | | |
|---|---|---|---|
| 4,720,432 A | 1/1988 | VanSlyke et al. | 428/457 |
| 4,885,211 A | 12/1989 | Tang et al. | 428/457 |
| 5,085,947 A | 2/1992 | Saito et al. | |
| 5,900,327 A | 5/1999 | Pei et al. | |
| 6,208,075 B1 | 3/2001 | Hung et al. | 313/504 |
| 6,208,077 B1 | 3/2001 | Hung | 313/506 |
| 6,249,085 B1 * | 6/2001 | Arai | 313/506 |

(Continued)

FOREIGN PATENT DOCUMENTS

CN    1294834    5/2001

(Continued)

OTHER PUBLICATIONS

Cacialli, F.; Friend, R. H.; Haylett, N.; Daik, R.; Feast, W. J.; dos Santos, D. A.; Brédas, J. L., "Efficient green light-emitting diodes from a phenylated derivative of poly(p-phenylene-vinylene)," Applied Physics Journal, vol. 69, No. 25, pp. 3794-3796.*

(Continued)

*Primary Examiner*—D. Lawrence Tarazano
*Assistant Examiner*—Camie S Thompson
(74) *Attorney, Agent, or Firm*—Greenblum & Bernstein, P.L.C.

(57) ABSTRACT

An organic EL device which drives over a wide range from low brightness to high brightness for light source applications, operates stably over a wide range of brightness and has excellent life property is provided. The device comprises at least one pair of electrodes 2 and 5, and a plurality of functional layers disposed between the electrodes 2 and 5, the functional layers comprising a layer 4 having the light emitting function, which is composed of at least one polymeric material and contains an organic solvent and a charge injection layer 3 composed of at least one inorganic material.

36 Claims, 6 Drawing Sheets

U.S. PATENT DOCUMENTS

| | | | |
|---|---|---|---|
| 6,379,824 B1 * | 4/2002 | Hosokawa | 428/690 |
| 6,416,888 B1 | 7/2002 | Kawamura et al. | |
| 6,423,428 B1 | 7/2002 | Towns et al. | |
| 6,605,823 B1 | 8/2003 | Pichler et al. | |
| 6,623,870 B1 * | 9/2003 | Epstein et al. | 428/690 |
| 6,847,162 B2 * | 1/2005 | Duggal et al. | 313/504 |
| 6,875,320 B2 * | 4/2005 | Raychaudhuri et al. | 204/192.12 |
| 7,151,341 B2 | 12/2006 | Pichler et al. | |
| 2001/0022497 A1 | 9/2001 | Aoki et al. | 313/507 |
| 2002/0155319 A1 | 10/2002 | Kawamura et al. | |
| 2003/0127969 A1 | 7/2003 | Aoki et al. | 313/503 |
| 2006/0186794 A1 | 8/2006 | Pichler et al. | |

FOREIGN PATENT DOCUMENTS

| | | |
|---|---|---|
| CN | 1297671 | 5/2001 |
| EP | 1 083 776 | 3/2001 |
| EP | 1 117 277 | 7/2001 |
| EP | 1128438 A | 8/2001 |
| JP | A-S59-194393 | 5/1984 |
| JP | A-H02-250952 | 10/1990 |
| JP | 3-77299 | 4/1991 |
| JP | 9-63771 | 3/1997 |
| JP | 11-067459 * | 3/1999 |
| JP | 2000-235893 | 8/2000 |
| JP | 2000-268973 | 9/2000 |
| JP | 2000-516760 | 12/2000 |
| JP | 2001-332386 | 11/2001 |
| JP | 2002-075661 | 3/2002 |
| JP | 2002-75661 | 3/2002 |
| JP | 2002367784 * | 12/2002 |
| JP | A-2003-7475 | 1/2003 |
| JP | 2003-59643 | 2/2003 |
| JP | 2003-282270 | 10/2003 |
| JP | 2004-228081 | 8/2004 |
| JP | A-2004-253175 | 9/2004 |
| JP | 2004-335468 | 11/2004 |
| WO | 97/33323 | 9/1997 |
| WO | 98/05187 | 2/1998 |
| WO | 98/13408 | 4/1998 |
| WO | 02/28983 | 4/2002 |

OTHER PUBLICATIONS

Chu et al., "High-performance organic thin-film transistors with metal oxide/metal bilayer electrode," Applied Physics Letters, vol. 87, No. 19, pp. 193508-1-103508-3, Nov. 2005.*
Deb et al., "Optical Properties and Color-Center Formation in Thin Films of Molybdenum Trioxide," Journal of Applied Physics, vol. 37, No. 13, pp. 4818-4825, Dec. 1966.*
Deb, S. K., "Physical Properties of a Transition Metal Oxide: Optical and Photoelectric Properties of Single Crystal and Thin Film Molybdenum Trioxide," Proceedings of the Royal Society of London, Series A, Mathermatical and Physical Sciences, vol. 304, No. 1477, pp. 211-231, Apr. 1968.*
He et al., "Photochromism of molybdenum oxide," Journal of Photochemistry and Photobiology C: Photochemistry Reviews, vol. 4, No. 2, pp. 125-143, Oct. 2003.*
Sian et al, "Optical, structural and photoelectron spectroscopic studies on amorphous and crystalline molybdenum oxide thin films," Solar Energy Materials and Solar Cells, vol. 82, No. 3, pp. 375-386, May 2004.*
English language abstract of JP 2000-268973, published Sep. 29, 2000.
English language abstract of JP 2002-075661, published Mar. 15, 2002.
Patent Abstract of Japan, vol. 2000, No. 11, Jan. 3, 2001.
Patent Abstract of Japan, vol. 15, No. 246, Jun. 24, 1991.
K. Murata et al., Applied Physics Letters, vol. 79, No. 8, pp. 1193-1195, Aug. 20, 2001.
J. Morgado et al., Applied Physics Letters, vol. 80, No. 14, pp. 2436-2438, Apr. 8, 2002.
S. Tokito et al., J. Phys. D: Appl. Phys., vol. 29, pp. 2750-2753, 1996.
English language Abstract of JP 9-63771. Published Mar. 7, 1997.
English language abstract of JP 2003-59643.
English language abstract of JP 2003-282270.
English Language Abstract of JP 2001-332386.
English language Abstract of CN1294834.
English language Abstract of CN 1297671.
Adachi et al., Applied Physics Letter 55(15), 1489-1491 (1989).
Adachi et al., Applied Physics Letter 57(6), 531-533 (1990).
Kido et al., Applied Physics Letter 61(7), 761763 (1992).
Adachi et al., Applied Physics Letter 66(20), 2679-2681 (1995).
Colvin et al., Nature, vol. 370, 354-357 (1994).
Hosokawa et al., Applied Physics Letter 61(21), 2503-2505 (1992).
Burroughes et al., Nature, 347, 539-541 (1990).
Nobuo Yoshimoto et a.., Extended Abstracts, Spring Meeting 2001, Springtime 48th The Japan Society of Applied Physics and Related Societies, Lecture Meeting Transcriptions, issued Mar. 28, 2001, No. 2, p. 636, "Optical Characteristics of $MoO_{3-x}$ Amorphous Thin Film Synthesized by Magnetron Sputtering Method" and 9 pages in English.
U.S. Appl. No. 12/340,447, filed Dec. 19, 2009, to Yatsunami et al.
English Language Abstract of JP 2004-335468 (Nov. 25, 2004).
English Language Abstract of JP 2004-228081 (Aug. 12, 2004).

* cited by examiner

ORGANIC ELECTROLUMINESCENT DEVICE AND METHOD FOR MANUFACTURING THE SAME

BACKGROUND OF THE INVENTION

1. Field of the Invention

The present invention relates to an organic electroluminescent device (hereinafter, abbreviated to an "organic EL device") which is an electroluminescent device used in various displays such as the display for cellular phones and various light sources, and to a method for manufacturing the same, and more particularly to an organic EL device comprising a polymeric luminescent material in an organic thin film, which can be driven in a wide range of brightness, from that of low brightness used in various display applications to high brightness used in light sources.

2. Description of the Related Art

Generally, organic EL devices are light emitting devices which utilizes the phenomenon of electroluminescence exhibited by solid fluorescent substances, and such organic EL devices have been widely put to practical use as miniature displays.

Organic EL devices can be classified to two types by the difference in the materials used in the light emitting layer. One type of organic EL devices uses an organic compound of low molecular weight in the light emitting layer, which is mainly produced by means of vacuum vapor deposition. The other type is polymeric organic EL devices which utilize a polymeric compound in the light emitting layer, which the present invention is related to.

Polymeric organic EL devices enable thin film formation by means of spin coating, ink-jet method, printing or the like by using a solution dissolving the material constituting each functional layer, and thus have drawn interest as a technology in which low production costs or device enlargement can be expected with simple and convenient processes.

A typical polymeric organic EL device is prepared by laminating a plurality of functional layers such as a charge injection layer, a light emitting layer and the like between an anode and a cathode. An explanation on the constitution of such a polymeric organic EL device and its manufacturing method will be given below.

First, a thin film of PEDOT:PSS (a mixture of polythiophene and polystyrenesulfonic acid; hereinafter, referred to as PEDOT) is formed as a charge injection layer by means of spin coating or the like, on a glass substrate onto which an ITO thin film has been formed as an anode. PEDOT is a substance practically used as a standard material for a charge injection layer, and being disposed adjacent to the anode, it functions as a hole injection layer.

A film of polyphenylenevinylene (hereinafter, referred to as PPV) and its derivatives, or of polyfluorene and its derivatives is formed as a light emitting layer on the PEDOT layer by spin coating or the like, and onto this light emitting layer, a film of metal electrode is formed as a cathode by vacuum vapor deposition to complete the device.

As such, a polymeric organic EL device has an excellent feature that the device can be produced by a simple process and has seen a variety of applications. However, there are still two problems to be solved, such as that sufficiently great luminescence intensity cannot be obtained, and that the device does not have a sufficient life property when driven for a long period of time.

Reduction, or deterioration, of the luminescence intensity of a polymeric organic EL device proceeds proportionally to the electric current passing through the device multiplied by the time for current flow. However, details of the process are not yet known, and an extensive study thereon is still being carried out.

Although there are many suspected causes for lowering of the luminescence intensity, deterioration of PEDOT is considered as one dominant cause. PEDOT, as described above, is a mixture of two polymeric materials such as polystyrenesulfonic acid and polythiophene, among which the former polymer is ionic and the latter has localized polarity in the polymer chain. Such Coulomb interaction attributable to anisotropy of charges allows moderate bonding between the two polymers and thus the excellent charge injection property of the material.

In order for PEDOT to exhibit excellent properties, intimate interaction between the two polymers is essential. However, a mixture of polymeric materials in general is likely to undergo phase separation owing to the delicate difference in the solubility to a solvent, and this is not an exception to PEDOT (Applied Physics Letters, Vol. 79, pp. 1193-1195). To undergo phase separation means that the moderate bonding of the two polymers is relatively easily breakable, and it implies that when PEDOT is driven in an organic EL device, it may be possibly unstable, or as a result of phase separation, may have adverse effects on other functional layers upon diffusion of a component not involved in the bonding, in particular an ionic component, caused by the electric field resulting from electric current flow. Thus, despite its excellent charge injection property, PEDOT is not considered as a stable substance.

In regard to such problems associated with PEDOT, it has been proposed to abandon PEDOT (Applied Physics Letters, Vol.79, pp.1193-1195). In this Non-Patent Document 1, it is proposed to use a silicon dioxide ($SiO_2$) layer having an electron-blocking action in place of a PEDOT layer. Even though this certainly improves the efficiency of the device as compared with the case where nothing is disposed between the ITO electrode and the light emitting layer, the properties of the device are rather poorer when compared with a device having a PEDOT layer.

It has been also proposed to insert a buffer layer having an electron-blocking function in a device with a PEDOT layer, between the PEDOT layer and the light emitting layer (Applied Physics Letters Vol. 80, pp. 2436-2438). When an electron-locking layer is inserted, there is an increase in the carrier density in the vicinity of the interface between the light emitting layer and the electron-blocking layer, thus improving the luminescence efficiency. Since an improvement of luminescence efficiency means an increase in the luminescence intensity with respect to the input power, in order to obtain an equivalent light intensity, the electric current passing through the device is decreased, and consequently deterioration of the PEDOT is lowered, thereby its durability being improved. However, as the current density is further increased, there reaches a realm where a further increase in the current density does no longer lead to an increase in the luminescence intensity. Therefore, there is a limit in the brightness obtained, and it is not possible to obtain higher brightness. Thus, it cannot be said to have the brightness obtainable at a sufficiently satisfactory level, and the durability is not sufficient, either.

Especially when such device is used in an exposure head as the light source, it requires the property of high brightness. Thus, extensive research is being conducted to meet the demand on further enhancement of the brightness.

Thus, polymeric organic EL devices have been illustrated. As described above, organic EL devices include a group of so-called polymeric organic EL devices using low molecular weight materials in the light emitting layer, and there are many proposals for improving the luminescence property for the group.

For example, in Patent Document 1 and Non-Patent Document 3, reduction in driving voltage of the device is attempted by laminating a thin film of oxides of vanadium (V), molybdenum (Mo), ruthenium (Ru) or the like, in place of the ITO electrode or on the ITO electrode. In these examples, the reason for insufficient durability of the device is considered to be attributable to the high barrier between the electrode and the hole transport layer or the light emitting layer and too much voltage applied on this barrier. Thus, reduction in the driving voltage and improvement in durability are attempted by using a thin film of metal oxide whose work function is greater than that of conventional anode material, ITO, and thereby lowering the barrier between the electrode and the hole transport layer or the light emitting layer (Japanese Patent Laid-Open Publication No. 93771 and Journal of Physics D: Applied Physics Vol. 29).

SUMMARY OF THE INVENTION

In view of such practical circumstances, an object of the present invention is to provide an organic EL device which can be driven over a wide range from low brightness used in display applications to high brightness used in light source applications, which works stably over a wide range of brightness, and which has excellent life property.

Further, another object of the present invention is to provide a method for easily manufacturing an organic EL device which works stably and has excellent life property.

The organic electroluminescent device of the invention comprises at least one pair of electrodes and a plurality of functional layers formed between the electrodes, and the functional layers include a layer having the light emitting function, which is composed of at least one polymeric material and a charge injection layer composed of at least one inorganic material.

According to this constitution, an organic electroluminescent device of very high luminescence intensity and stable properties can be obtained by the use of inorganic materials in the charge injection layer. This is deemed possible because unlike PEDOT in which the moderate bonding between two polymeric materials due to the Coulomb interaction is easily breakable, the materials do not become unstable with an increased current density and can maintain stable properties, leading to an enhancement of the luminescence intensity. Having such a charge injection layer composed of at least one inorganic material, the device can maintain the luminescence intensity and luminescence efficiency at high levels over a wide range of current density and becomes more durable. Therefore, an organic electroluminescent device which works stably over a wide range of brightness, up to a high brightness value, and has excellent life property, can be realized. In this case, it is preferred that the light emitting layer is a conjugated polymer.

Furthermore, the organic electroluminescent device of the invention is characterized in that the functional layers comprise at least one type of buffer layer.

According to this constitution, the use of at least one buffer layer allows to prevent, for example, the loss of electrons through the anode, thereby preventing the current flow from contributing to luminescence.

Further, the organic electroluminescent device of the invention is characterized in that the buffer layer is composed of a polymeric layer.

The organic electroluminescent device of the invention is characterized in that the buffer layer contains an organic solvent.

Such constitution allows formation of the device without a vacuum operation, since the buffer layer can be formed by a coating method.

The organic electroluminescent device of the invention is characterized in that the buffer layer uses a material whose absolute value for an energy value representing an electron affinity of the buffer layer (hereinafter, referred to as the electron affinity) is smaller than the electron affinity of the layer having the light emitting function.

According to such constitution, loss of charges can be blocked, and the charges are made to contribute effectively to luminescence within the light emitting layer.

Further, the organic electroluminescent device of the invention is characterized in that the layer having the light emitting function is composed of a polymeric compound containing a fluorene ring. The polymeric compound containing a flourene ring as used herein means that the polymer is constituted of a fluorene ring bonded to a desired group. There are commercially available polymer compounds having a variety of bonded groups, but detailed explanation thereof will not be presented here.

Furthermore, the organic electroluminescent device of the invention is characterized in that the layer having the light emitting function is composed of a polyfluorene represented by the following formula (I):

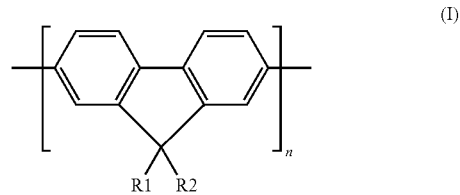

wherein R1 and R2 each represents a substituent, and a derivative thereof.

The organic electroluminescent device of the invention is characterized in that the layer having the light emitting function is composed of a compound having a phenylenevinylene group.

The organic electroluminescent device of the invention is characterized in that the layer having the light emitting function comprises a polyphenylenevinylene represented by the following formula (II):

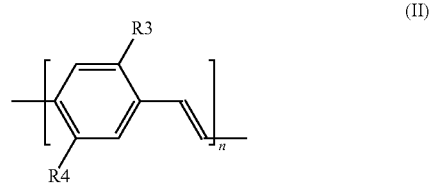

wherein R3 and R4 each represents a substituent, and a derivative thereof.

The organic electroluminescent device of the invention is characterized in that the charge injection layer is composed of an oxide.

The organic electroluminescent device of the invention is also characterized in that the charge injection layer is composed of an oxide of a transition metal.

Further, examples of the oxide used herein include oxides of chromium (Cr), tungsten (W), vanadium (V), niobium (Nb), tantalum (Ta), titanium (Ti), zirconium (Zr), halfnium (Hf), scandium (Sc), yttrium (Y), thorium (Tr), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), tin (Sn), lead (Pb), antimony (Sb), bismuth (Bi), or rare earth elements including from lanthanium (La) to lutetium (Lu). Among these, aluminum oxide (AlO), copper oxide (CuO) and silicon oxide (SiO) are particularly effective in increasing the device durability.

The organic electroluminescent device of the invention is characterized in that the charge injection layer is composed of an oxide of molybdenum or of vanadium.

Thus, the charge injection layer in particular can be formed using one selected from an oxide of a transition metal such as molybdenum, vanadium or the like, or a nitride.

For example, since a transition metal compound takes a plurality of oxidation states, a plurality of electric potential levels can be taken, and easy charge injection leads to reduction in the driving voltage.

The organic electroluminescent device of the invention is also characterized in that the charge injection layer comprises a nitride.

Further, the organic electroluminescent device of the invention is characterized in that the charge injection layer comprises a nitride of a transition metal.

There are a large variety of nitrides, and most of them are utilized as functional materials. Film formation can be carried out mainly by sputtering or by CVD. There are many known compounds from those used as semiconductors to those of very high insulation property. After a number of experiments, it was found that carrier injection is made possible for the compounds of high insulation property by forming a film to a thickness of approximately 5 nm or less. Examples of specific compounds include the following, and preferred is titanium nitride (TiN). TiN is known to be a very tough material and is thermally stable.

In addition, use can be also made of gallium nitride (GaN), indium nitride (InN), aluminum nitride (AlN), boron nitride (BN), silicon nitride (SiN), magnesium nitride (MgN), molybdenum nitride (MoN), calcium nitride (CaN), niobium nitride (NbN), tantalum nitride (TaN), vanadium nitride (VN), zinc nitride (ZnN), zirconium nitride (ZrN), iron nitride (FeN), copper nitride (CuN), barium nitride (BaN), lanthanum nitride (LaN), chromium nitride (CrN), yttrium nitride (YN), lithium nitride (LiN), titanium nitride (TIN) and complex nitrides thereof.

The organic electroluminescent device of the invention is characterized in that the charge injection layer comprises an oxynitirde.

The organic electroluminescent device of the invention is also characterized in that the charge injection layer comprises an oxynitride of a transition metal.

For example, oxynitride crystals ($Ru_4Si_2O_7N_2$) of ruthenium (Ru) can be applied to the charge injection layer by being formed into films, since the material is highly refractive (1500° C.) and stable. In this case, film formation can be carried out by forming a film by means of the sol-gel process and subsequent heat treatment.

In addition, use can be also made of oxynitride including SiAlONs of the elements of Groups IA, IIA and IIIB such as barium SiAlON (BaSiAlON), calcium SiAlON (CaSiAlON), cerium SiAlON (CeSiAlON), lithium SiAlON (LiSiAlON), magnesium SiAlON (MgSiAlON), scandium SiAlON(Sc-SiAlON), yttrium SiAlON (YSiAlON), erbium SiAlON (Er-SiAlON), neodymium SiAlON (NdSiAlON), or multi-element SiAlONs. These can be processed by CVD, sputtering or the like. In addition, lanthanum nitrosilicate (LaSiON), lanthanum europium nitrosilicate ($LaEuSi_2O_2N_3$), silicon oxynitride ($SiON_3$) and so on can be used. Since most of them are an insulator, the thickness of the thin film should be as thin as about 1 nm to 5 nm. These compounds are highly efficient in the exciton containment and can be formed on the side of electron injection.

The organic electroluminescent device of the invention is characterized in that the charge injection layer comprises an oxynitride.

For some unknown reason, it was possible to greatly improve the luminescence intensity when a complex oxide including a transition metal was used in the charge injection layer.

Furthermore, there are many types of complex oxides, and most of them have interesting electronic properties. The compounds listed below are specific examples, but they are not intended to limit the scope:

Barium titanate ($BaTiO_3$), strontium titanate ($SrTiO_3$), calcium titanate ($CaTiO_3$), potassium niobate ($KNbO_3$), bismuth iron oxide ($BiFeO_3$), lithium niobate ($LiNbO_3$), sodium vanadate ($Na_3VO_4$), iron vanadate ($FeVO_3$), vanadium titanate ($VTiO_3$), vanadium chromate ($VCrO_3$), nickel vanadate ($NiVO_3$), magnesium vanadate ($MgVO_3$), calcium vanadate ($CaVO_3$), lanthanum vanadate ($LaVO_3$), vanadium molybdate ($VMoO_5$), vanadium molybdate ($V_2MoO_8$), lithium vanadate ($LiV_2O_5$), magnesium silicate ($Mg_2SiO_4$), magnesium silicate ($MgSiO_3$), zirconium titanate ($ZrTiO_4$), strontium titanate ($SrTiO_3$), lead magnesate ($PbMgO_3$), lead niobate ($PbNbO_3$), barium borate ($BaB_2O_4$), lanthanum chromate ($LaCrO_3$), lithium titanate ($LiTi_2O_4$), lanthanum cuprate ($LaCuO_4$), zinc titanate ($ZnTiO_3$), calcium tungstate ($CaWO_4$) and the like.

Any of these compounds may be used to carry out the invention, although barium titanate ($BaTiO_3$), for example, is preferred. $BaTiO_3$ is a representative dielectric and a complex oxide with high insulation property. However, it was found from the results of a number of experiments that when used in the form of a thin film, the compound permits carrier injection. $BaTiO_3$ or strontium titanate ($SrTiO_3$) is a stable compound and has a high dielectric constant so that efficient carrier injection can be performed. Upon film formation, the film-forming process can be selected appropriately from sputtering, sol-gel process, CVD and so on.

The organic electrluminescent device of the invention is characterized in that the buffer layer is disposed between the charge injection layer disposed on a hole injection side and the layer having the light emitting function.

According to this constitution, it is possible to block the loss of electrons, and thus electrons can contribute effectively to luminescence within the layer having the light emitting function.

Furthermore, the organic electroluminscent device of the invention is characterized in that the anode is formed on a light transmitting substrate, the charge injection layer is composed of a hole injection layer formed on the anode and of an electron injection layer which is formed on the layer having the light emitting layer so as to face the hole injection layer via the layer having the light emitting function. That is, the organic luminescent device of the invention comprises an anode formed on a light transmitting substrate, a hole injection layer formed on the anode, a buffer layer formed on the hole injection layer, an electron injection layer formed on the layer having the light emitting function to face the hole injection layer via the layer having the function, and a cathode.

According to this constitution, since a buffer layer such as an electron-blocking layer is formed on the side of the hole injection layer where the loss of electrons is likely to occur, and the layer having the light emitting function is formed above these layers, it can be prevented that the layer having the light emitting function is damaged upon the formation of the hole injection layer. Here, it is preferable to form a multi-layered structure in which a layer having a small work function, such as a calcium (Ca) layer or a barium (Ba) layer, to facilitate electron injection is disposed on the side of the light emitting layer as a cathode.

A method according to the invention is a method for manufacturing an organic electroluminescent device, comprising at least one pair of electrodes and a plurality of functional layers formed between the electrodes, the functional layers comprising a layer having a light emitting function, which is composed of at least one polymeric material and a charge injection layer composed of at least one inorganic material, wherein the layer having the light emitting function is formed by supplying a polymeric compound solution.

According to the method, since the layer having the light emitting function is formed by supplying a solution by means of a coating method, an ink-jet method, a sol-gel process or the like, the layer can be formed without undergoing a vacuum process, thus leading to less facility investment and easier enlargement.

Further, a method according to the invention comprises the steps of forming an electrode on the surface of a light transmitting substrate; forming the charge injection layer composed of an inorganic material layer on the electrode by means of vacuum film deposition; forming a buffer layer by supplying the polymeric compound solution onto the charge injection layer; forming the layer having the light emitting function, which is composed of at least one polymeric material, by supplying the polymeric compound solution onto the buffer layer; and forming an electrode on the layer having the light emitting function.

According to the method, since the charge injection layer is formed by vacuum film deposition, less deterioration of the layers occurs, and high brightness and high durability are achieved effectively. Also, since the subsequent steps are carried out as wet processes, less facility investment and easier enlargement may be expected.

Furthermore, with regard to the compounds, compounds with different valencies may be present, and it is also possible to take compounds in the form of having different valencies, in addition to those exemplified above.

The layer having the light emitting function is not limited to having merely the light emitting function, but to include other functions such as the charge transport function or the like. In the embodiments presented below, the term is simply referred to as the light emitting layer.

The organic electroluminescent device of the invention allows stable operation over a wide range of brightness up to a high brightness traditionally unachievable and has excellent life property, and thus it is made possible to obtain stable electron injection over a wide range of driving conditions from mild conditions for display applications to harsh conditions of strong electric field, large current, and high brightness, and to maintain the luminescence efficiency.

DESCRIPTION OF THE PREFERRED EMBODIMENTS

Preferred embodiments of the invention will be illustrated in detail with reference to the drawings in the following.

Embodiment 1

Figure 1:
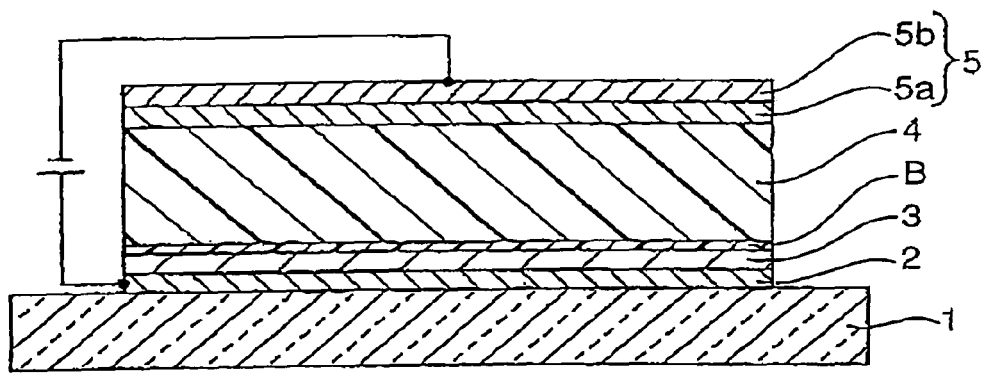
FIG. 1 is a schematic diagram of the polymeric organic EL device of Embodiment 1 of the invention.

FIG. 1 is a schematic diagram of the polymeric organic EL device according to the embodiment of the invention.

The present embodiment is characterized in that a thin film of metal oxide is formed as a charge injection layer 3 on a transparent anode 2 formed on a light transmitting substrate 1, and laminated thereon are a layer of polymeric material as a buffer layer B having the electron-blocking function, and another layer of polymeric material as a light emitting layer 4, with a cathode 5 being formed above them all.

That is to say, the organic electroluminescent device of the embodiment consists of, as shown in FIG. 1, substrate 1 made of a transparent glass material, an ITO layer (indium titanium oxide) as an anode 2 formed on the substrate 1, a thin film of metal oxide as charge injection layer 3 formed thereon, an electron-blocking layer made of a polymeric material as buffer layer B, light emitting layer 4 made of a polymeric material, and a cathode 5 made of a metallic substance.

On taking the anode 2 of the organic EL device as the positive electrode and cathode 5 as the negative electrode and applying a direct voltage or a direct current, holes are injected from the anode 2 through the charge injection layer 3 and the buffer layer B to the light emitting layer 4, and electrons are injected from the cathode 5. In the light emitting layer 4, the luminescence phenomenon takes place as thus injected holes and electrons recombine, and the excitons resulting from this shift from the excited state to the basal state.

According to the organic electroluminescent device of the embodiment, the charge injection layer 3 is composed of a thin film of metal oxide, allows holes to be injected in easily, and with the buffer layer B blocking the loss of electrons, enables electrons to contribute to luminescence effectively within the layer having the light emitting function. Consequently, a good luminescent property can be obtained, and a device highly reliable even at high temperatures can be obtained.

Next, the process for preparation of the organic electroluminescent device of the invention will be explained.

First, an ITO thin film is formed on a glass substrate 1 by sputtering, and then a thin film of a metal oxide is formed by vacuum vapor deposition. By patterning them by photolithography, an anode 2 and a charge injection layer 3 are formed.

Then, a buffer layer B and a light emitting layer 4 composed of a polymeric material are formed by a coating method. Finally, a cathode 5 is formed.

According to the method of the invention, since the buffer layer B and the light emitting layer 4 are formed by means of coating of polymeric materials, preparation is easy and enlargement of the device is possible.

EXAMPLE 1

Next, Examples of the invention will be presented.

The structure is identical with the structure given in FIG. 1, and it will be explained with reference to FIG. 1.

The organic electroluminescent device of Example 1 is composed of a substrate 1 made of a 1 mm-thick glass sheet referred to as Corning 7029#, an anode 2 composed of a 20 nm-thick ITO thin film formed thereon, a charge injection layer 3 composed of a 20 nm-thick thin film of molybdenum oxide formed on the anode 2, a 20 nm-thick buffer layer B of a polyfluorene-based compound, in particular poly[9,9-dioctylfluorenyl-2,7-diyl]-alt-co-(N,N'-diphenyl)-N,N'-di(p-butyl-oxyphenyl)-1,4-diaminobenzene, formed on the charge injection layer 3, a 80 nm-thick light emitting layer 4 composed of a polyfluorene-based compound, in particular poly[(9, 9-dioctylfluorenyl-2,7-diyl)-o-1,4-benzo-{2, 1'-3}-thiadiazole, and a cathode 5 which is formed on the light emitting layer 4 and is composed of a 20 nm-thick calcium (Ca) layer 5a and a 100 nm-thick aluminum (Al) layer 5b.

The materials for the buffer layer and the light emitting layer are commercially available from, for example, Nihon SiberHegner KK.

Figure 2:
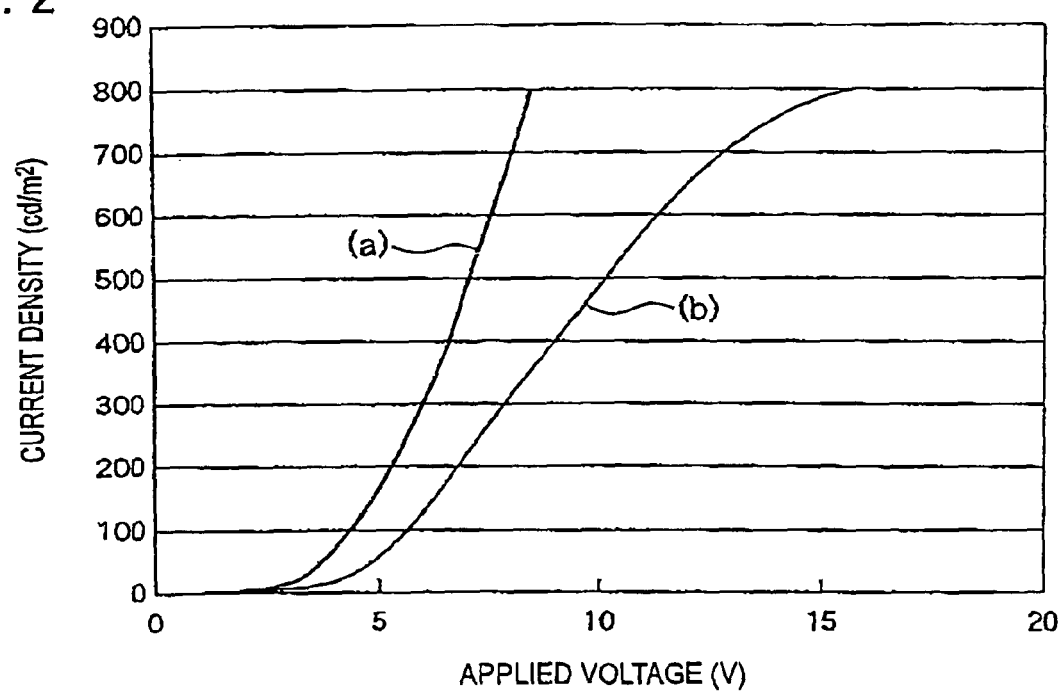
FIG. 2 is a plot showing the relationship between the applied voltage and the corresponding current density for the molybdenum oxide device of Example 1 of the invention.
Figure 3:
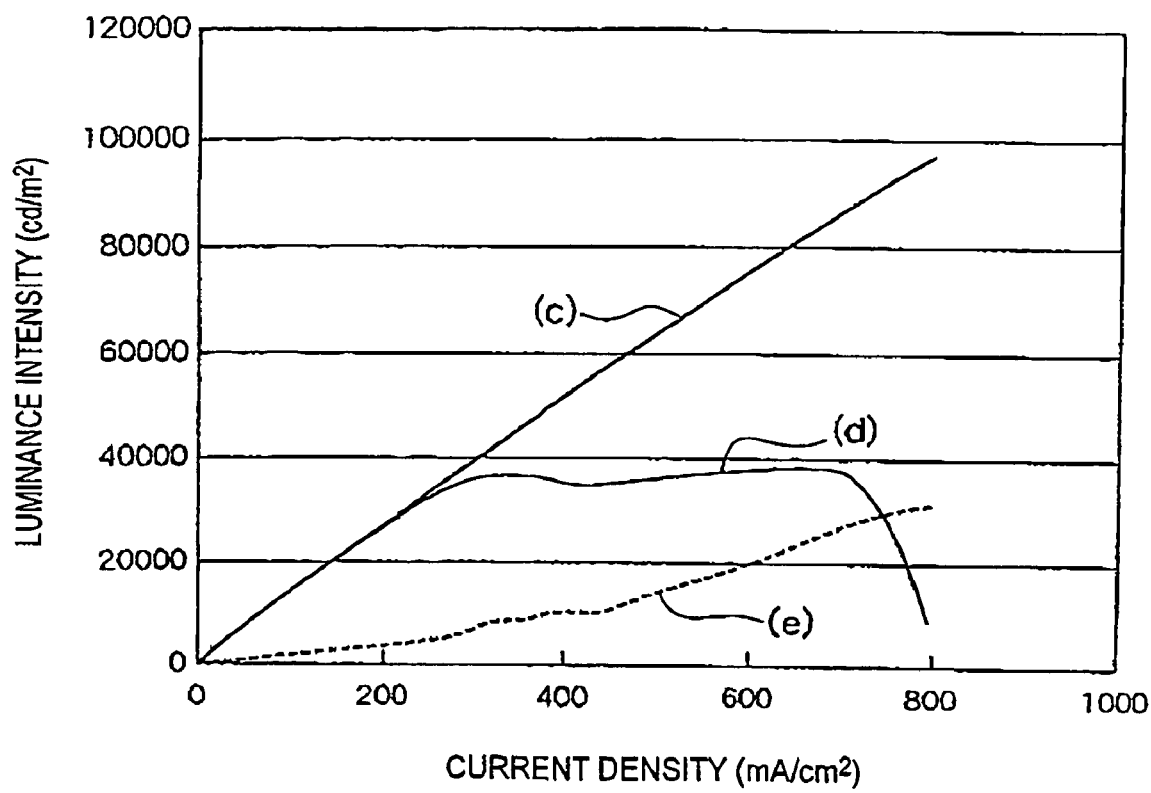
FIG. 3 is a plot showing the relationship between the current density and the luminescence intensity of Example 1 of the invention.

Thus formed organic electroluminescent device (FIG. 1) using molybdenum oxide for the charge injection layer (hereinafter, referred to as the "molybdenum oxide device") is connected to a direct current power source, and the applied voltage and the current flow at that voltage are converted to a value per a unit area. A current density-applied voltage curve showing the conversion relationship is presented in FIG. 2. The vertical axis in the plot represents the current density (mA/cm$^2$) and the horizontal axis the applied voltage (V). Here, a luminescence intensity-current density curve showing the relationship between the current density of the molybdenum oxide device and the intensity of the luminescence induced from the molybdenum oxide device is given in FIG. 3. The vertical axis of the plot represents the luminescence intensity (cd/m$^2$) and the horizontal axis the current density (mA/cm$^2$). In FIG. 2, a plot for the device of Comparative Example 1 in which PEDOT replaces the molybdenum oxide thin film in the device of FIG. 1 (referred to as the PEDOT device) is presented in parallel for comparison. Further, in FIG. 3, the device of Comparative Example 2 (referred to as the device without the buffer layer) in which the buffer layer is excluded from the device of FIG. 1 is presented, in addition to the PEDOT device of Comparative Example 1, for comparison. In FIGS. 2 and 3, the symbols in the plots are given such that (a) and (c) represent the molybdenum oxide device, (b) and (d) represent the PEDOT device, and (e) represents the device without the buffer layer, respectively.

As it is obvious from the comparison of curve (a) representing Example 1 with curve (b) representing Comparative Example 1 in FIG. 2, in the case of the molybdenum oxide device of Example 1 of the invention, the rise of the curve starts earlier and the gradient is steep. Thus, it can be seen that even when the current density exceeds 800 (mA/cm$^2$), the IV property can maintain virtual linearity.

Furthermore, according to curve (c) representing the molybdenum oxide device of Example 1 in FIG. 3, surprisingly it is seen that the luminescence intensity maintains good linearity over a wide range from the region of one-digit number to the region of 100,000 (cd/cm$^2$). To the contrary, according to curve (d) representing the PEDOT device of Comparative Example 1, the device of Comparative Example 1 shows linearity in the luminescence intensity-current density curve only up to 40,000 (cd/cm2), and a higher luminescence intensity could no longer be obtained, Meanwhile, for the device without the buffer layer of Comparative Example 2, it can be seen from curve (e) that the luminescence intensity obtained for the current density is small, and that the current does not effectively contribute to the luminescence.

These FIGS. 2 and 3 indicate that the molybdenum oxide device, which is the organic electroluminescent device of Example 1 of the invention, can operate stably over a wide range of luminescence intensity and can result in a luminescence intensity of high efficiency.

Figure 4:
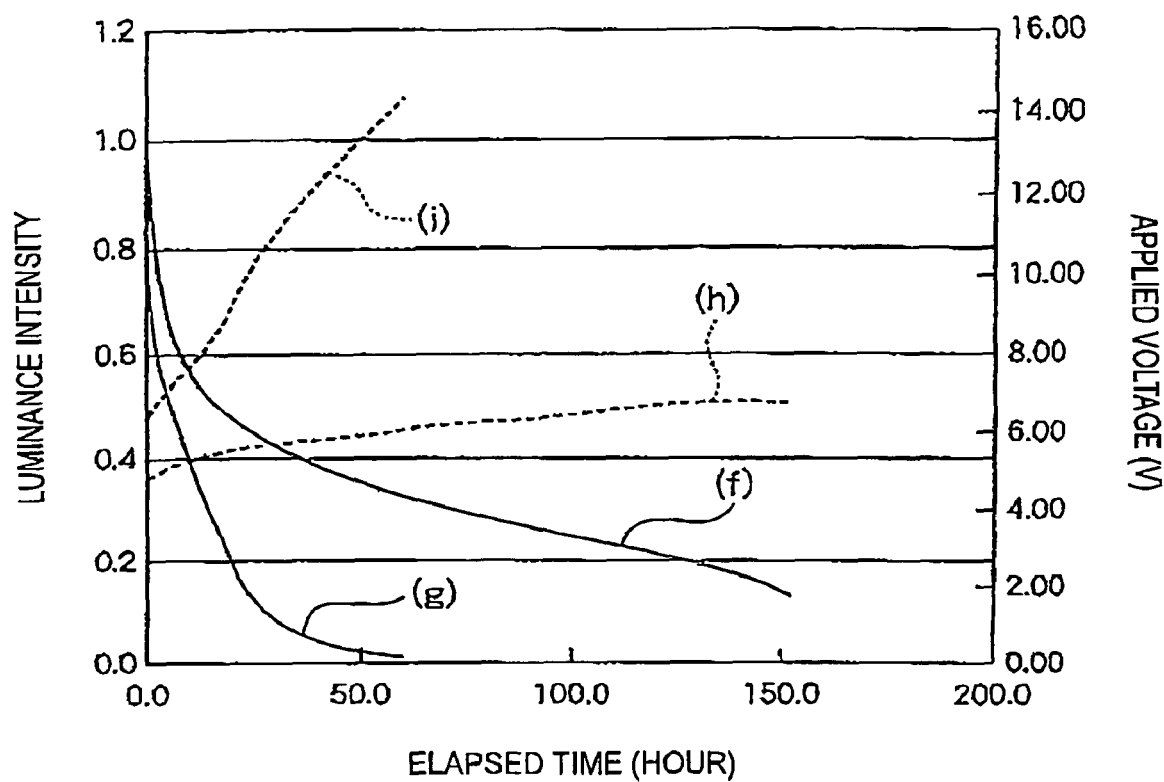
FIG. 4 is a plot showing the changes with time in the brightness at a constant current driving and the applied voltage for the molybdenum oxide device of Example 1 of the invention.

In addition, FIG. 4 represents the change of the luminescence brightness with time for the molybdenum oxide device of Example 1 when it is driven at a constant current (140 mA/cm$^2$), and the change in the applied voltage with time required to maintain the current value constant. FIG. 4 also presents the plot for the PEDOT device of Comparative Example 1 in parallel for comparison. Furthermore, in order to render the comparison of the change in brightness of the two devices more easily recognizable, the luminescence brightness is normalized to the luminescence brightness to the initial value at the beginning of the evaluation. The symbols in the plots are given such that (f) represents the change in the luminescence brightness of the molybdenum oxide device of Example 1, (g) the change in the luminescence brightness of the PEDOT device of Comparative Example 1, (h) the change in the applied voltage with time for the molybdenum oxide device of Example 1, and (i) the change in the applied voltage with time of the PEDOT device of Comparative Example 1, respectively.

In FIG. 4, as shown in curves (h) and (i) representing the relationship between the elapsed time and the applied voltage for the molybdenum oxide device of Example 1 and the PEDOT device of Comparative Example 1, it is clear that the molybdenum oxide device of Example 1 does not result in an increase in the applied voltage over a long time and can realize highly reliable driving. Further, as shown in curves (f) and (g) representing the relationship between the elapsed time and the luminescence intensity for the molybdenum oxide device of Example 1 and the PEDOT device of Comparative Example 1, it can be seen that the molybdenum oxide device of Example 1 results in less lowering of the luminescence intensity over a long time and thus lasts longer.

As such, the PEDOT device of Comparative Example 1 allows current flow at from a relatively lower voltage, but owing to the high resistance of the PEDOT film, the current density does not rise highly even with an increase of voltage (FIG. 2). It is also shown that a tendency for saturation is observed in a region of high voltage, that is, a region of large current density, and it is impossible to obtain a further increase in the current density. To the contrary, in the case of the molybdenum oxide device of Example 1 of the invention, current flow starts at from a low current value, and since the resistance of the molybdenum oxide thin film is low, the increase in the voltage is rapid and linear as well This indicates that the molybdenum oxide thin film has excellent properties over PEDOT as the charge injection layer. Further, the molybdenum oxide device of Example 1 of the invention is not observed to have saturation in a region of large current, unlike the PEDOT device. Such feature is ideal for the voltage-current density properties of organic EL devices. Such excellent feature of the molybdenum oxide device tends to be maintained for the luminescence intensity as explained below.

In FIG. 3, in the case of the PEDOT device, the luminescence intensity increases proportionally to the current in the region of low current density, but the tendency rapidly reaches to a limit, a tendency of saturation as in FIG. 2 being observed and the brightness being abruptly lowered in the region of large current This is believed to be caused by rapid deterioration due to the high current density. The surface of the device after evaluation shows significant visible discoloration and thus the device undergoing an irreversible change. In fact, the device after evaluation cannot reproduce the initial properties upon reevaluation. The device without the buffer layer does not show a tendency to reach a limit, unlike the PEDOT device, but the luminescence intensity is lower than the PEDOT device over virtually the entire region. This is believed to happen since the device without the buffer layer does not have the electron-blocking function provided by the buffer layer, and thus a portion of the electrons injected from the cathode to the light emitting layer leak to the molybdenum oxide thin film without contributing to luminescence.

In this regard, the superiority of the molybdenum oxide device is obvious. It shows an increase in the luminescence intensity which is equivalent to the PEDOT device even at lower current density regions and which is also proportional to the current up to higher current density regions. The increase in the luminescence intensity is proportional to the current density, and the efficiency of luminescence is constant over a wide range of current values. Further, the device after evaluation shows virtually no deterioration in spite of the huge currents passed through, and exhibits reproducible properties under repeated tests.

This is truly surprising. The area of the luminescent part of the device used in evaluation was only 10 mm$^2$, and the thickness only a few hundred nanometers. Thus, at the highest brightness of 800 mA/cm$^2$ as indicated in FIG. 3, this much small and thin device is actually subjected to an energy of 600 mW or more. Although an organic EL device has high luminescence efficiency which is the ratio of conversion of the input power to light, it still cannot avoid heat generation, and thus the molybdenum oxide device also becomes very hot after evaluations such that it cannot be touched by bare hands. Moreover, such high temperature represents what is felt through a glass substrate, and thus it can be easily expected for the temperature of the device itself upon illumination to be very high.

As such, the reasons for the molybdenum oxide thin film having such excellent properties when used as the charge injection layer cannot be clearly understood, but a hypothesis for the phenomenon based on the model of a general charge-injection apparatus can be given as in the following. The following explanation is only an assumption, and the factual phenomenon has not been clarified yet.

Figure 5:
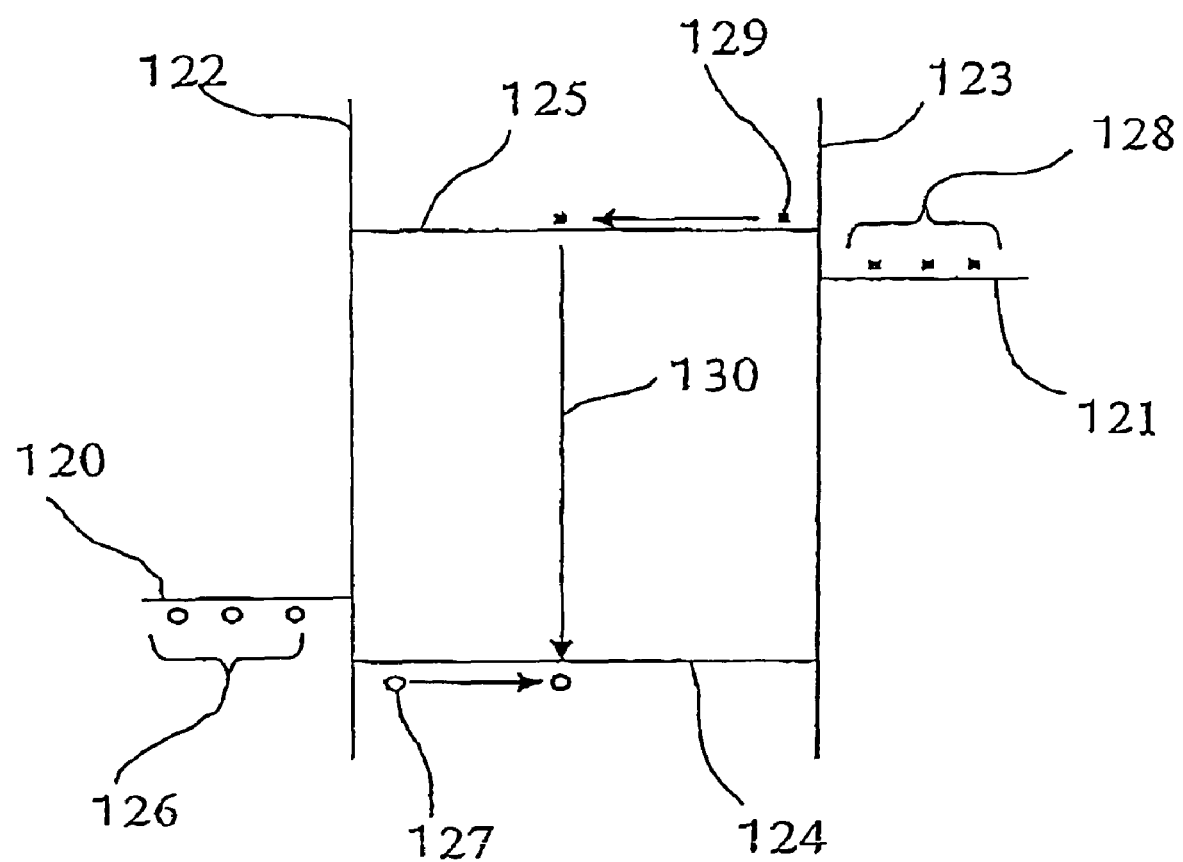
FIG. 5 is a diagram of the band structure for explaining the mechanism of Example 1 of the invention.
Figure 6:
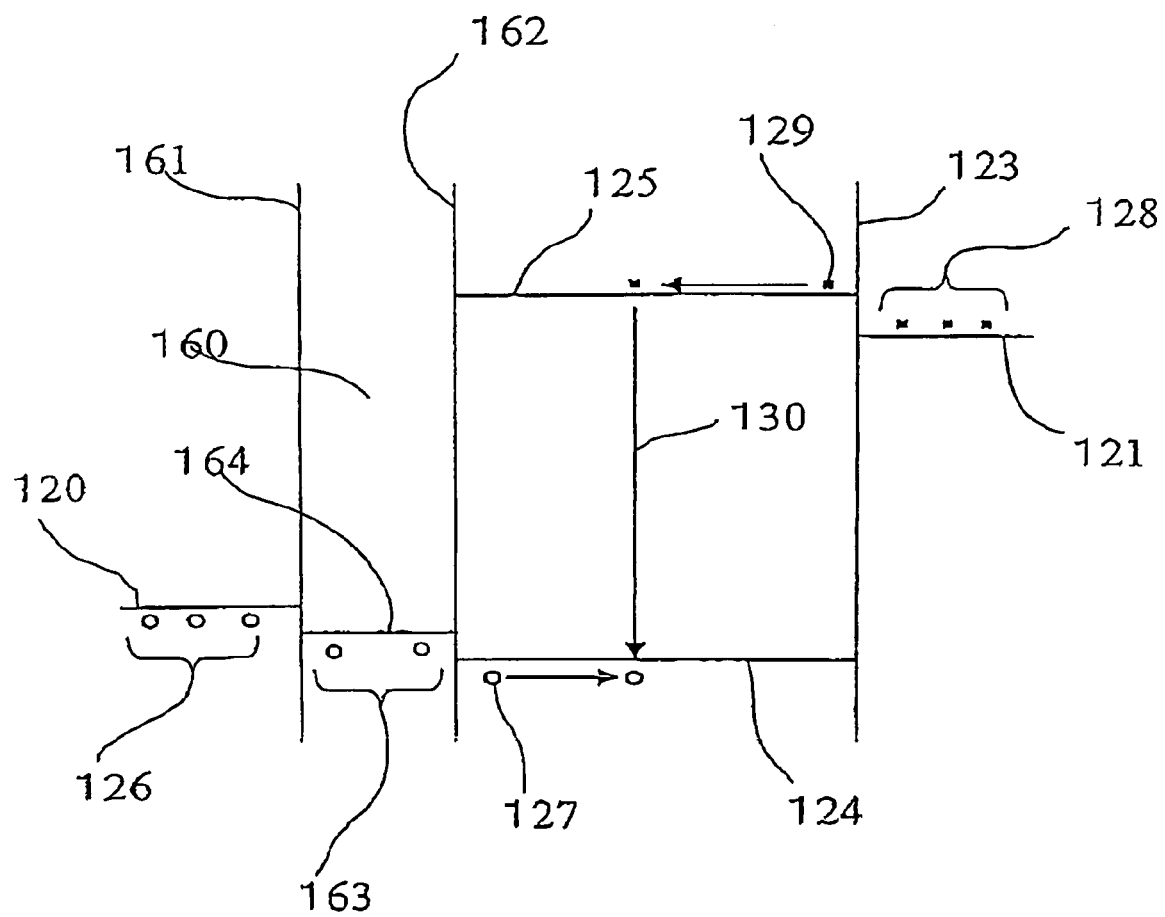
FIG. 6 is a diagram of the band structure for explaining the mechanism of Example 1 of the invention.
Figure 7:
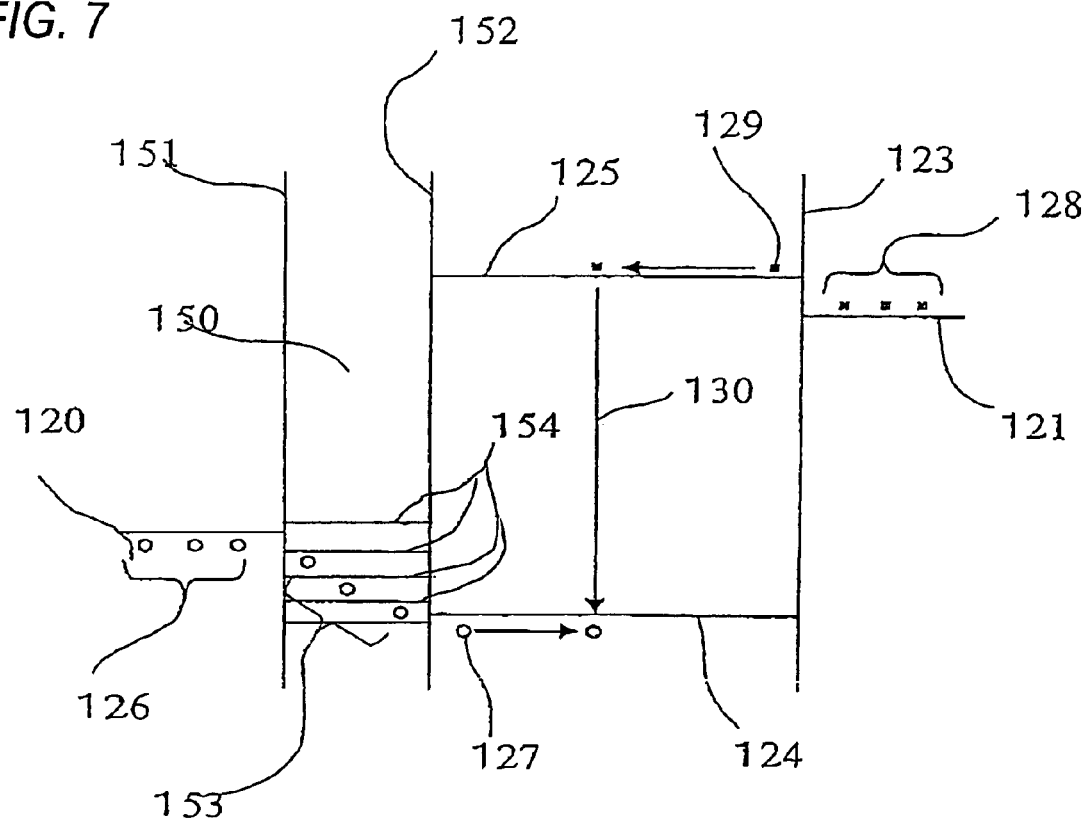
FIG. 7 is a diagram of the band structure for explaining the mechanism of Example 1 of the invention.

FIG. 5 is a schematic outline of the explanation on the energy state of charges in a simplest organic EL device. FIG. 6 is a schematic outline of the explanation on the energy state of charges in a device having the structure in FIG. 5 and further having a PEDOT layer as the charge injection layer. FIG. 7 is a schematic outline of the explanation on the energy state of charges in a device having the structure in FIG. 5 and further having a molybdenum oxide layer as the charge injection layer.

In FIG. 5, reference numeral 120 is a line representing the energy level of the anode; 121 is a line representing the energy level of the cathode; 122 a line representing the interface between the anode and the functional layer involved in luminescence (hereinafter, referred to as the light emitting layer); 123 is a line representing the interface between the cathode and the light emitting layer; 124 represents the highest occupied molecular orbital (HOMO) of the light emitting layer; and 125 represents the lowest unoccupied molecular orbital (LUMO). 126 represents holes on the anode; 127 represents a hole injected into the light emitting layer; 128 represents electrons on the cathode; 129 represents an electron injected in the light emitting layer; and 130 is a line representing the recombination of the hole 127 injected into the light emitting layer and the electron 129 injected into the light emitting layer.

Furthermore, in FIG. 6, reference numeral 160 represents the area of PEDOT as the charge injection layer; 161 is a line representing the interface between the anode and the PEDOT layer, 162 is a line representing the interface between the PEDOT layer and the light emitting layer; 163 represents the holes in the PEDOT layer; and 164 represents the corresponding energy level in the PEDOT layer. Further in FIG. 7, reference numeral 150 represents the area of the molybdenum oxide thin film as the charge injection layer; 151 is a line representing the interface between the anode and the molybdenum oxide thin film; 152 is a line representing the interface between the molybdenum oxide thin film and the light emitting layer; 153 represents the holes in the molybdenum oxide thin film; and 154 is a line representing the corresponding energy level in the molybdenum oxide thin film.

Prior to an explanation, it is further explained that FIGS. 5, 6 and 7 are mere simplified and modeled diagrams. These are given to present the minimal concept necessary to explain the phenomena, and it is obvious that the actual device operations are much more complicated.

First, an explanation will be given on the operation of a simplest organic EL device with reference to FIG. 5.

Luminescence of an organic EL device takes place upon liberation of the energy for the recombination of a hole and an electron in the form of light, identically to inorganic LEDs. First, as described in FIG. 5, holes 126 on the anode are injected to the HOMO 124 of the light emitting layer, and electrons 128 on the cathode are injected to the LUMO of the light emitting layer. Holes 127 and electrons 129 injected to the light emitting layer move in the opposite directions towards the counter electrodes within the light emitting layer along the applied electric field. Each of the charges encounters with the counter electric current with a constant probability during migrating within the light emitting layer to generate a hole-electron pair, or exciton is a so-called packet. An exciton is so-called a packet of energy, and when this energy is released in the form of light, the device undergoes light emission.

Next, the injection of charges in the invention will be explained in detail.

In FIG. 5, attention is to be given to line 120 representing the energy level of the anode, and line 127 representing the HOMO of the light emitting layer. The positions of the lines in FIG. 5 represent as such the energy levels in the electric field, and the difference in height between line 120 and line 124 represents as such the difference in the energy levels of the two. A difference in the energy levels means that the holes in the respective energy levels have different energy values. In a surface as in FIG. 5, it is generally defined such that holes in a lower level have higher energies, and electrons in a higher level have higher energies. Thus, the holes 127 in the light emitting layer have higher energies than the holes 126 on the anode. Here, in order to inject the holes 126 on the anode having lower energies into the light emitting layer, it is necessary to supply an external energy corresponding to the energy difference between the holes 126 and the holes 127, and a portion of the voltage applied to the device is used for this purpose.

In this point of view, it may be simply thought that only application of a voltage corresponding to the difference in energy levels is necessary to carry out the injection of carriers. However, in practice, the use of the charge injection layer enables the injection of carriers to a substantially lower voltage. This is the same for both the anode and the cathode, but only the phenomenon occurring on the anode side, which is related to the invention, will be further explained here.

FIG. 6 is a diagram illustrating the energy levels of the device having PEDOT 60 as the charge injection layer on the anode side of the simplest organic EL device described in FIG. 5. The energy levels of PEDOT may be substantially considered as a single level, and this is generally constituted to be located intermediately between the energy levels of the anode and of the light emitting layer.

However, when injection of holes is performed, holes transit leaping over the energy level from the anode to the light emitting layer, but the probability of such transition depends on the difference between the average energy possessed by the holes and the energy level to which transition occurs. Higher the average energy possessed by the holes and smaller the difference in energy levels, more holes are injected to the light emitting layer. Here, hole injection is easier in the device having the constitution of FIG. 6 than in the device having the constitution of FIG. 5, because the energy level of PEDOT 164 is disposed in between the energy level of the anode 120 and the energy level of the light emitting layer 124. When the same voltage, that is, the same energy is applied to the holes in the devices with the constitutions of FIGS. 5 and 6, transition of holes occur very easily in the device of FIG. 6, since the energy level of PEDOT 164 exists in the part of a smaller energy level difference compared with the energy level of the light emitting layer 127. Further, the holes reaching the energy level of PEDOT 164 transit easily to the energy level of the light emitting layer 124 for the same reasons.

This can be understood more easily in the following way. Imagine the case of a man ascending the staircase. In this case, rather than ascending a large step at one time, it is easier to ascend in two steps, with a platform disposed in the intermediate. The same applies to the injected holes. In the act of ascending the steps, although the potential energy finally obtained is identical regardless of the presence or absence of the platform, the procedure to reach the final destination is carried out more easily.

However, the molybdenum oxide thin film described in the present embodiment allows easier charge injection than PEDOT As the reason is explained in a similar way, it can be considered that a single platform is formed in the case of PEDOT while a number of steps are formed in the molybdenum oxide thin film, and ascending the steps has become easier.

In FIG. 7, there are a plurality of energy levels 154 in the molybdenum oxide thin film 150. These are the energy levels expressed as the staircase. As the energy level extending from the anode 120 to the light emitting layer 124 is finely divided, it becomes easier for the holes 153 which migrate within the molybdenum oxide thin film to transit among a plurality of energy levels 153 of smaller differences.

However, the reasons that a plurality of energy levels 154 which are expressed as steps, be formed in the molybdenum oxide thin film can be construed to originate from the composition of the molybdenum oxide thin film.

The molybdenum oxide thin film of this embodiment is an amorphous thin film prepared by vacuum vapor deposition. The environment for vacuum vapor deposition is under a reducing atmosphere, and in the process of deposition on the substrate by means of heating and sublimation, molybdenum oxide is reduced. The reduced molybdenum oxide generates, in addition to $MoO_3$ of valency 6, a number of oxides having smaller oxidation states. These are, for example, tetravalent $MoO_2$ or trivalent $Mo_2O_3$. Since reduction is equivalent to accepting electrons, the reduced oxide with a smaller valency enters the state to release electrons more easily, that is, the state to accept holes more easily, than an oxide with a larger valency. This is equivalent to having an energy level of upper potential as illustrated in FIGS. 5 to 7.

Consequently, the step-like structure of a plurality of energy levels, as presented in FIG. 7 as the energy level 154 of molybdenum oxide, is generated. The energy level 154 of molybdenum oxide in FIG. 7 can be interpreted such that the lowest energy level corresponds to a valency of 6, and valency becomes high as the energy levels becomes high.

As such, it is contemplated that a plurality of energy levels 154 expressed as the above-mentioned steps are formed. To be more precise, the variation of energy levels attributable to the amorphous film should also be considered, in addition to the oxides with different valencies. The energy levels as conventionally discussed in oxides or nitrides are based on the crystalline states. In complicated structures with dangling bonds, like amorphous films, there are many compounds formed as thin films having a plurality of energy levels, more or less, as explained herein.

As explained thus far, by reducing the driving voltage and preventing the loss of electrons from the anode to reduce the ineffective current as will be explained below, the efficiency can be enhanced, but luminescence intensity requires large current. In a region of large current, deterioration of a PEDOT device proceeds rapidly, mainly because acceleration of deterioration by the generated heat is expressed more conspicuously. In this connection, since molybdenum oxide is an inorganic material and is essentially tough against heat, it is believed that the effect of continuously maintaining stable properties over a wide range of current density regions is obtained.

Such property of molybdenum oxide being tough against heat is maximally expressed in the application of high molecular weight organic EL devices. In general, a low molecular weight organic EL device has a constitution in which low molecular weight organic compounds constituting the functional layers are formed into films by vacuum vapor deposition, in particular as amorphous thin films on the substrate, which makes the device weak in a high-temperature environment. This is because when the functional layers are exposed to a high temperature, crystallization of low molecular weight organic compounds occurs and the device properties deteriorate. The crystallization temperature is only in the vicinity of one hundred and a few ten degrees Celsius, and raising this crystallization temperature while maintaining the sublimation property required in vapor deposition has become one problem to be solved in the field of low molecular weight organic EL materials. That is to say, since the functional layers, such as the light emitting layer, composed of an organic material are thermally weak, even though molybdenum oxide of the charge injection layer is tough against heat, the properties cannot be completely expressed.

To the contrary, polymeric organic EL materials are strong under a high-temperature environment. This is because the polymer material constitutes a thin film such that long molecular chains are heavily entangled with each other. A polymeric material does not have a specific temperature of crystallization, but only an index referred to as the glass transition temperature, or the softening temperature. Further, there are many polymeric organic EL materials which even do not show clear glass transition temperatures. In other words, polymeric organic EL materials cannot freely move around to crystallize even when exposed to high temperatures, owing to their entangled structures. This general feature in polymeric materials is expressed as a superior property of heat-resistance, when polymeric materials are applied to organic EL devices.

The molybdenum oxide device of the present Example can constitute a more stable device even under severe conditions such as large current density, with the combination of an essentially thermally strong molybdenum thin film and a polymeric organic EL material, and can realize an excellent effect of good charge-injecting property that is originally expected from molybdenum oxides.

Here, there rises another question of why a PEDOT device is rapidly deteriorated when PEDOT is also a polymer. This does not contradict the thermal stability of polymer.

As described above, the good charge-injecting property of a PEDOT device originates from the sophisticated interaction of two polymers. The abrupt deterioration of a PEDOT device under a large current density is not the deterioration of the polymeric material itself constituting PEDOT but the deterioration due to a change in the physical structure of the polymer. That is, such change means a breakage in the moderate bonding of two polymer materials caused by the Coulomb interaction, or a change in the state of ongoing phase separation. A property of PEDOT dominantly results from its structure, and a change in the structure leads to the loss of the property.

Meanwhile, although a molybdenum oxide device has excellent properties as such, the driving of an organic EL device in the region of large current as shown in FIGS. 2 and 3 is not general at present, and apparently its practical meaning is likely to be overlooked. However, when the device is used as a light source such as an exposure head, it needs to be of high brightness. Furthermore, it is true that moderate deterioration proceeds even under the mild driving conditions of low brightness in displays, and it is found to be accelerated by heat. That is, deterioration of an organic EL device is also subject to the kinetics which is based on the activation energy, as observed in many other chemical phenomena. This indicates that, deterioration under mild driving conditions certainly corresponds to an observation at a slow rate of a phenomenon proceeding under severe conditions. Therefore, it is clear that like the molybdenum oxide device of the present embodiment, a device which is stable under severe conditions such as a large current density and is superior to a PEDOT device, has the same excellent properties under mild driving conditions, too. In this regard, an explanation will be given with reference to FIG. 4.

FIG. 4 is a plot for the luminescence brightness at driving a molybdenum oxide device and a PEDOT device at a constant current density of 140 mA/cm$^2$ and the applied voltage required to generate a constant current. When a current of 140 mA/cm$^2$ was flown, both of the two devices emit light at a high brightness around 15,000 cd/m$^2$. This brightness is very high for general applications such as displays, but as shown from FIG. 3, it falls under a region where even a PEDOT device can emit light proportionally to the current density. Thus, this region is suitable for a comparison of the two devices.

From FIG. 4, it is clear that the molybdenum oxide device greatly surpasses the PEDOT device in the life property. Further, it can be said that with respect to the change with time of the applied voltage, which serves as one index for the state change of a device, the molybdenum oxide device is moderate in such change and shows good stability, compared with the PEDOT device. The relationship between the two factors is never reversed even under milder conditions as required in applications such as displays.

EXAMPLE 2

Next, Example 2 of the invention will be discussed.

In Example 1 above, a polyfluorene-based compound was used in the light emitting layer, but this Example uses a PPV-based material, poly[2-methoxy-5-(2-ethylhexyloxy)-1,4-phenylenevinylene], in the light emitting layer 4. This material is also commercially available from Nihon Siber-Hegner KK., like Example 1.

The other structures are constituted identically with Example 1.

In this case, the luminescence intensity can be increased further in the universal.

Furthermore, in Example 1 and Example 2 a glass substrate was used as the substrate 1, but it is not limited to glass. Generally glass is used. Also in the present Example, a glass substrate is employed. There have been proposed as the substrate material, a number of materials including glass, plastic film and the like, and these all can be employed as the substrate 1 in the present invention. In addition, if the direction of light extraction is taken to be the plane opposite to the substrate, an opaque substrate such as a ceramic substrate or a metallic substrate may also be used.

For the substrate 1, any of the following can be appropriately selected and used: inorganic glass, for example, inorganic oxide glass such as light transmitting or transflective soda lime glass, barium/strontium-containing glass, lead glass, aluminosilicate glass, borosilicate glass, barium borosilicate glass, quartz glass, and inorganic fluoride glass; polymeric film such as light transmitting or transflective polyethylene terephthalate, polycarbonate, polymethyl methacrylate, polyether sulfone, polyvinyl fluoride, polypropylene, polyethylene, polyacrylate, amorphous polyolefin, fluorine-based resins or the like; materials including the oxides or nitrides of metal, including light transmitting or transflective chalcogenoid glass such as $As_2O_3$, $As_{40}S_{10}$, $S_{40}Ge_{10}$ or the like, ZnO, $Nb_2O$, $Ta_2O_5$, SiO, $Si_3N_4$, $HfO_2$ or $TiO_2$; a light-blocking semiconductor material such as silicon, germanium, silicon carbide, gallium arsenide or gallium nitride; an above-mentioned light transmitting substrate material, including pigments; or metallic materials insulated on the surface. It is also possible to use a laminated substrate having a plurality of substrate materials laminated thereon.

For an anode 2, an electrode made up of ITO is used. Since ITO is highly conductive and has a good light transmitting property, it is widely used for the electrode of the light extraction side. In this Example, a film of ITO is formed on a substrate by sputtering, and then patterning is appropriately carried out by means of photolithography. When light is not emitted through the anode, a light-blocking metallic material can constitute the anode. For the material for electrode, use can be made of, in addition to transparent conductive films such as ITO, tin oxide ($SnO_2$), zinc oxide (ZnO) or the like, metals with large work function such as chromium (Cr), nickel (Ni), copper (Cu), tin (Sn), tungsten (W) or gold (Au), or alloys and oxides thereof. Further, since a stable and highly reliable charge injection layer is used, the electrode may be composed of a material with low resistance and required properties, with the freedom of choice being conducted. In this way, deterioration of the electrode itself can be prevented.

A molybdenum oxide thin film functioning as the charge injection layer 3 in the Example is formed on the substrate 1, onto which ITO patterning has been formed as anode 2, by means of vacuum vapor deposition. In the Example, the thickness of the molybdenum oxide thin film is 20 nm. The thickness of the molybdenum oxide thin film is not particularly limited, but as long as a uniform film is obtained, the minimum thickness is also effective. Precaution should be taken since a film too thin or too thick in general does not allow to obtain approximately uniform film thickness in many cases. Further, since a molybdenum oxide thin film is slightly colored, a too thick film would result in a lowered light extraction efficiency. However, depending on the application, slight coloring may give an effect of enhancing the contrast ratio of luminescence/non-luminescence, thus being rather preferable. A thickness of the molybdenum oxide thin film in the range of about 1 nm to 200 nm is suitable in carrying out the invention.

Furthermore, with respect to the charge injection layer 3 shown in FIG. 1, which is made of an inorganic material, the oxides of a number of transition metals such as vanadium (V), copper (Cu), nickel (Ni), ruthenium (Ru), titanium (Ti), zirconium (Zr), tungsten (W), yttrium (Y), lanthanum (La) or the like, in addition to the molybdenum oxide, exhibit the same properties. Although slightly poor in the injection property, most of the nitrides of transition metals, including the above-mentioned metals, are also effective.

In order to obtain good electron-blocking function, the electron affinity of the buffer layer B of the invention is preferably smaller than the electron affinity of the light emitting layer. For example, polyfluorene-based compounds such as poly[9,98-dioctylfluorene-co-N-(4-butylphenyl)-diphenylamine] can be mentioned, but the material for the buffer layer is limited by the luminescent material. The material for the buffer layer in the Example has sufficiently small electron affinity with respect to the luminescent material and satisfies the requirements. The thickness of the buffer layer of the Example is 10 nm, and the layer is laminated on the molybdenum oxide thin film by spin coating. The 10 nm-thick buffer layer can provide the electron-locking function. Since increasing the film thickness of the buffer layer eventually increases the driving voltage of the device, too large a thickness is not preferred. Approximately 50 nm or less is preferable. Further, the buffer layer may be made of a material having not only the electron-blocking function, but also improved adhesion or having energy levels in between the charge injection layer and the light emitting layer. The buffer layer is formed by spin coating, and it may also be composed of an inorganic material and formed successively and continuously, when the charge injection layer is formed by a dry process such as vacuum vapor deposition.

It is also possible to use a material not having the special electric properties as possessed by polymeric organic EL materials, conventionally referred to as plastics, such as polystyrene-based compounds, polycarbonate-based compounds or acrylic compounds. Although these materials have high insulating property, high insulating property implies a large band gap, and the electron affinity of these plastics are generally small. Of course, it is not preferable to have a large film thickness because the materials' high insulating property leads to an increase in the driving voltage for the device. However, an appropriate film thickness can lead to the realization of the invention.

As such, the buffer layer B may be made of an inorganic material, in addition to polymeric compounds, and may not have the electron-blocking function as shown in the Example. For example, it is sufficient with a material that can promote an improvement in the adhesion between the light emitting layer and the charge injection layer, or a material that allows lowering of the barrier for hole injection to the extent that leakage of electrons can be suppressed. When the light emitting layer is made of a material with a high electron transport property such as polyfluorene, it is essential to have a buffer layer with the electron-blocking function. But, when it is a material with a low electron transport property such as PPV, the electron-blocking function may be absent.

For the buffer layer B, there is a need to select the material appropriately in consideration of the polymeric organic EL material constituting the light emitting layer 4, as described above. In this Example, since a requirement for the buffer layer B is to have an electron affinity smaller than the electron affinity of the light emitting layer 4, for example, use can be made of the materials which can be originally used for the light emitting layer 4. Thus, it is possible to select from a number of materials comprising the compounds represented by the formula (I) and the formula (II), and derivatives thereof.

In Example 1 and Example 2 above, the light emitting layer 4 was formed using a polyfluorene-based compound or a PPV-based compound formed into a film of about 80 nm thick by spin coating. The thickness of the light emitting layer 4 should be modified appropriately depending on the use conditions for the device. A film thickness in the range of 50 to 200 nm is suitable for the invention. In this regard, similar to other thin films, a film with excessively small thickness does not allow uniform film thickness to be obtained, and a film with excessively large thickness is not preferred because the voltage required for driving increases to an excessive degree.

Embodiment 2

Figure 8:
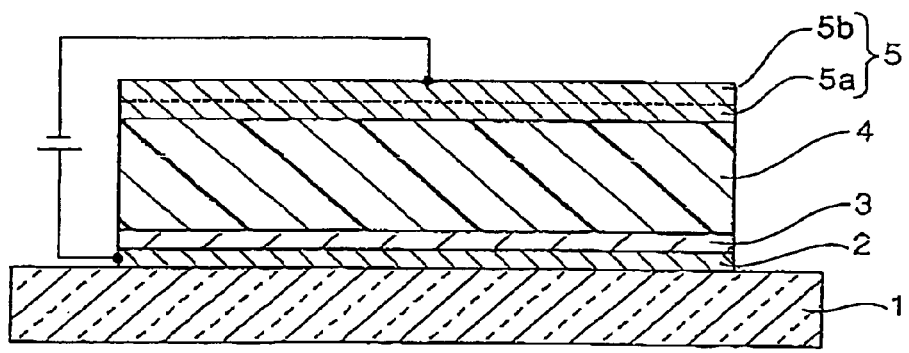
FIG. 8 is a schematic diagram of the polymeric organic EL device of Embodiment 2 of the invention.

FIG. 8 is a cross-sectional view of the core of the organic EL device of Embodiment 2 of the invention.

The organic EL device as illustrated is different from that of Embodiment 1 because the former does not have the buffer layer B. For constituents other than that, it is identical with the structure in FIG. 1 used in Embodiment 1.

In the description above, the organic EL device is a direct current driving type, but may also be driven by alternating current or alternating voltage, or pulse wave.

The light emitted from the organic EL device is to be extracted from the substrate 1, but light may also be extracted from the side opposite to the substrate 1 (here, from cathode 5), or from the lateral sides.

For the light emitting layer of the invention, use can be made of, in addition to polyfluorene-based compounds or PPV-based compounds, copolymers containing these, so-called the pendant-type polymeric compounds in which low molecular weight luminescent compounds are chemically bonded to the main polymer chain, mixtures of high molecular weight organic EL materials and low molecular weight organic EL materials, and various blends of these materials, with adequate modifications.

The structures of polyfluorene and PPV are represented by the formula (I) and the formula (II), respectively, and there have been proposed a large number of derivatives derived from the above structures as the basic skeleton. For example, WO 9813408 or WO 0228983 provides detailed descriptions on the derivatives of PPV and polyfluorene. These compounds belong to a group of substances called the conjugated polymeric compounds. They can be used in the light emitting layer in combination with suitable buffer materials to provide the effect of the invention.

When a material with high hole-transport property is used in the light emitting layer, a buffer layer having a hole-blocking function can be disposed on the cathode side to enhance the luminescence efficiency.

The pendant-type polymeric materials may be obtained by bonding the luminescent materials conventionally used in the low molecular weight organic EL device to a polymer skeleton, and such combinations are limitless. Thus, it is not practical to illustrate every case of them. Further, there are numerous types of mixtures comprising high molecular weight organic EL materials and low molecular weight organic EL materials. These are described in detail in "Organic EL Devices and the Frontier to the Industrialization" published by NTS, Limited.

When the light emitting layer is made of a polymeric material, it is possible to manufacture large organic EL devices, for uniform film thickness can be obtained even with large-scale devices. Further, as the thermal stability of the light emitting layer is increased, it is possible to inhibit the generation of defects or pinholes at the interfaces between layers, and thus highly stable organic EL devices can be manufactured.

In addition, when these functional layers (the light emitting layer, or hole injection layer formed if necessary, or charge injection layer) are formed from polymeric materials, they can be formed by wet processes such as spin coating, casting, dipping, bar coating, roll coating or the like. In this way, since there is no need for large-scale vacuum facilities, film formation by inexpensive equipment is possible, and production of large organic EL devices is made possible. Further, since the interlayer adhesion in the organic EL devices is improved, device short circuit can be prevented, and thus highly stable organic EL devices can be formed.

When used in color displays, it is necessary to separately apply the light emitting layers each expressing one of the colors RGB. This can be easily carried out by means of ink-jet method.

For the cathode 5 of the organic electroluminescent device, a metal or an alloy with low work function can be used. In addition to the bilayer structure of Ca—Al, the bilayer structure of Ba—Al; metals such as Ca, Ba, In, Mg or Ti; Mg alloys such as Mg—Ag alloy or Mg—In alloy, or Al alloys such as Al—Li alloy, Al—Sr alloy or Al—Ba alloy may be used. Lamination structures such as $LiO_2$/Al or LiF/Al are suitable for the cathode material.

A transparent cathode can be formed by forming an ultrathin film with high light transmission property using a metal having a small work function, and laminating a transparent electrode thereon. Using this transparent cathode, a device construction called the top emission can be obtained.

As such, a polymeric organic EL device having an inorganic compound for the charge injection layer maintains the luminescence intensity and luminescence efficiency of the device at high levels over a wide range of current density, and exhibits good durability. Therefore, an organic electroluminescent device which operates stably over a wide range of brightness and which has excellent life property can be obtained.

Further, the film-forming techniques for the layers constituting an organic electroluminescent device of the invention are not limited to the above-described ones and may be suitably selected vacuum film formation such as vacuum vapor deposition, electron beam deposition, molecular beam epitaxy, sputtering, reactive sputtering, ion plating, laser afflation, thermal CVD, plasma CVD or MOCVD, or wet processes such as sol-gel process, Langmuir blow-jet method (LB method), layer-by-layer, spin coating, ink-jet method, dip coating or spraying. Consequently, any method capable of film formation to exhibit the effects of the invention may be used.

The organic EL device according to the invention operates stably over a wide range of brightness and has excellent life property, and thus it is useful in a variety of applications including flat panel displays, display devices and light sources.

This application is based upon and claims the benefit of priority of Japanese Patent Application Nos. 2003-417812, filed on Dec. 16, 2003, 2004-301560, filed on Oct. 15, 2004, and 2004-301561, filed on Oct. 15, 2004, the contents of all of which are herein incorporated by reference in their entireties.

What is claimed is:

1. An organic electroluminescent device comprising:
    at least one pair of electrodes; and
    a plurality of functional layers formed between the electrodes,
    wherein the functional layers include:
        a layer having a light emitting function, which comprises at least one polymeric material;
        a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
        at least one buffer layer positioned between the layer having a light emitting function and the charge injection layer, the at least one buffer layer comprising a polyfluorene-based compound.

2. The organic electroluminescent device according to claim 1,
    wherein the layer having a light emitting function comprises a polymeric compound having a fluorene ring.

3. The organic electroluminescent device according to claim 2,
    wherein the layer having a light emitting function comprises a polyfluorene represented by the following formula (I):

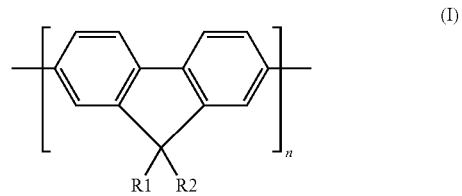

wherein R1 and R2 each represents a substituent.

4. The organic electroluminescent device according to claim 1,
    wherein the layer having a light emitting function comprises a compound having a phenylenevinylene group.

5. The organic electroluminescent device according to claim 4,
    wherein the layer having a light emitting function comprises a polyphenylenevinylene represented by the following formula (II):

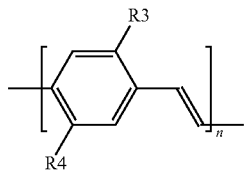

(II)

wherein R3 and R4 each represents a substituent.

6. The organic electroluminescent device according to claim 1, wherein the charge injection layer comprises an additional oxide.

7. The organic electroluminescent device according to claim 6, wherein the additional oxide comprises a transition metal.

8. The organic electroluminescent device according to claim 1, wherein the charge injection layer further comprises a nitride.

9. The organic electroluminescent device according to claim 8, wherein the nitride comprises a nitride of a transition metal.

10. The organic electroluminescent device according to claim 1, wherein the charge injection layer further comprises an oxynitride.

11. The organic electroluminescent device according to claim 10, wherein the oxynitride comprises an oxynitride of a transition metal.

12. The organic electroluminescent device according to claim 1, wherein the charge injection layer comprises an additional complex oxide including a transition metal.

13. The organic electroluminescent device according to claim 1, wherein one of the pair of electrodes is formed on a light transmitting substrate as an anode; the charge injection layer comprises a hole injection layer formed on the anode and of an electron injection layer which is formed on the layer having a light emitting function so as to face the hole injection layer via the layer having a light emitting function; and the other one of the pair of electrodes is formed on the electron injection layer as a cathode.

14. An organic electroluminescent device comprising:
at least one pair of electrodes; and
a plurality of functional layers formed between the electrodes,
wherein the functional layers include:
a layer having a light emitting function, which comprises at least one polymeric material;
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer, the at least one buffer layer having an electron-blocking function; and
wherein an absolute value for an energy value representing an electron affinity of the at least one buffer layer is smaller than an absolute value for an energy value representing an electron affinity of the layer having a light emitting function.

15. An organic electroluminescent device comprising:
at least one pair of electrodes; and
a plurality of functional layers formed between the electrodes,
wherein the functional layers include:
a layer having a light emitting function, which comprises at least one polymeric material;
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer, the at least one buffer layer having an electron-blocking function; and
wherein the charge injection layer further comprises vanadium oxide.

16. An organic electroluminescent device comprising:
at least one pair of electrodes; and
a plurality of functional layers formed between the electrodes,
wherein the functional layers include:
a layer having a light emitting function, which comprises at least one polymeric material;
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer, the at least one buffer layer having an electron-blocking function; and
wherein the at least one buffer layer comprises a polymeric layer.

17. An organic electroluminescent device comprising:
at least one pair of electrodes; and
a plurality of functional layers formed between the electrodes,
wherein the functional layers include:
a layer having a light emitting function, which comprises at least one polymeric material and contains an organic solvent; and
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer, the at least one buffer layer comprising a polyfluorene-based compound.

18. The organic electroluminescent device according to claim 17, wherein the layer having a light emitting function comprises a polymeric compound containing a fluorene ring.

19. The organic electroluminescent device according to claim 18, wherein the layer having a light emitting function comprises a polyfluorene represented by the following formula (I):

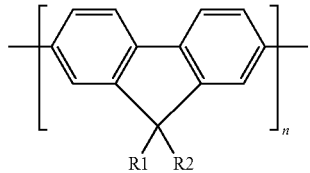

(I)

wherein R1 and R2 each represents a substituent.

20. The organic electroluminescent device according to claim 17,
wherein the layer having a light emitting function comprises a compound having a phenylenevinylene group.

21. The organic electroluminescent device according to claim 20,
wherein the layer having a light emitting function comprises a polyphenylenevinylene represented by the following formula (II):

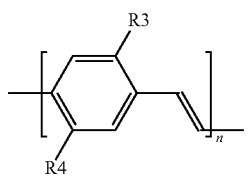

(II)

wherein R3 and R4 each represents a substituent.

22. The organic electroluminescent device according to claim 17,
wherein the charge injection layer comprises an additional oxide.

23. The organic electroluminescent device according to claim 22,
wherein the additional oxide comprises a transition metal.

24. The organic electroluminescent device according to claim 17,
wherein the charge injection layer further comprises a nitride.

25. The organic electroluminescent device according to claim 24,
wherein the nitride comprises a nitride of a transition metal.

26. The organic electroluminescent device according to claim 17,
wherein the charge injection layer further comprises an oxynitride.

27. The organic electroluminescent device according to claim 26,
wherein the oxynitride comprises an oxynitride of a transition metal.

28. The organic electroluminescent device according to claim 17,
wherein the charge injection layer comprises an additional complex oxide including a transition metal.

29. The organic electroluminescent device according to claim 17,
wherein an anode as one of the pair of electrodes is formed on a light transmitting substrate;
the charge injection layer comprises a hole injection layer formed on the anode and of an electron injection layer which is formed on the layer having a light emitting function so as to face the hole injection layer via the layer having a light emitting function; and
a cathode as the other one of the pair of electrodes is formed on the electron injection layer.

30. An organic electroluminescent device comprising:
at least one pair of electrodes; and
a plurality of functional layers formed between the electrodes,
wherein the functional layers include:
a layer having a light emitting function, which comprises at least one polymeric material and contains an organic solvent; and
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer; and
wherein the at least one buffer layer comprises a polymeric layer.

31. An organic electroluminescent device comprising:
at least one pair of electrodes; and
a plurality of functional layers, formed between the electrodes,
wherein the functional layers include:
a layer having a light emitting function, which comprises at least one polymeric material and contains an organic solvent; and
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer; and
wherein the at least one buffer layer comprises an organic solvent.

32. An organic electroluminescent device comprising:
at least one pair of electrodes; and
a plurality of functional layers, formed between the electrodes,
wherein the functional layers include:
a layer having a light emitting function, which comprises at least one polymeric material and contains an organic solvent; and
a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
at least one buffer layer positioned between the layer having a light emitting function and the charge injection layer; and
wherein an absolute value for an energy value representing an electron affinity of the at least one buffer layer is smaller than an absolute value for an energy value representing an electron affinity of the layer having a light emitting function.

33. An organic electroluminescent device comprising:
at least one pair of electrodes; and
a plurality of functional layers formed between the electrodes,
wherein the functional layers include:
- a layer having a light emitting function, which comprises at least one polymeric material and contains an organic solvent; and
- a charge injection layer comprising at least one inorganic material, the charge injection layer being formed by a dry process and the at least one inorganic material comprising a molybdenum trioxide and a molybdenum oxide of valency 4 and a molybdenum oxide of valency 3; and
- at least one buffer layer positioned between the layer having a light emitting function and the charge injection layer; and wherein the charge injection layer comprises vanadium oxide.

34. A method for manufacturing an organic electroluminescent device which comprises at least one pair of electrodes and a plurality of functional layers formed between the electrodes,
wherein the functional layers include a layer having a light emitting function which comprises at least one polymeric material; and a charge injection layer comprising at least one inorganic material, the at least one inorganic material comprising a molybdenum trioxide and a molybdenum oxide of valency 4 and a molybdenum oxide of valency 3; and at least one buffer layer positioned between the layer having a light emitting function and the charge injection layer, the at least one buffer layer comprising a polyfluorene-based compound, and comprising the method of:
forming the layer having a light emitting function by supplying a polymeric compound solution, forming the charge injection layer by a dry process, and forming the at least one buffer layer comprising a polyfluorene-based compound between the layer having a light emitting function and the charge injection layer.

35. The method according to claim 34, further comprising:
forming one electrode on a surface of a light transmitting substrate;
forming the charge injection layer comprising an inorganic material layer on the one electrode by vacuum film deposition;
forming the at least one buffer layer by supplying polymeric compound solution onto the charge injection layer;
forming the layer having a light emitting function, which comprises at least one polymeric material, by supplying the polymeric compound solution onto the at least one buffer layer; and
forming the other electrode on the layer having a light emitting function.

36. The method according to claim 34,
wherein the forming the layer having a light emitting function is carried out by a coating method.

* * * * *